(12) United States Patent
Lee et al.

(10) Patent No.: US 7,667,225 B1
(45) Date of Patent: Feb. 23, 2010

(54) LIGHT EMITTING DEVICE

(76) Inventors: Chung Hoon Lee, 1B-35, 727-5, Wonsi-dong, Danwon-gu, Gyeonggi-do, Ansan-si (KR) 425-851; Dae Won Kim, 1B-35, 727-5, Wonsi-dong, Danwon-gu, Gyeonggi-do, Ansan-si (KR) 425-851; Dae Sung Kal, 1B-35, 727-5, Wonsi-dong, Danwon-gu, Gyeonggi-do, Ansan-si (KR) 425-851; Ki Bum Nam, 1B-35, 727-5, Wonsi-dong, Danwon-gu, Gyeonggi-do, Ansan-si (KR) 425-851

( * ) Notice: Subject to any disclaimer, the term of this patent is extended or adjusted under 35 U.S.C. 154(b) by 0 days.

(21) Appl. No.: 12/541,749

(22) Filed: Aug. 14, 2009

Related U.S. Application Data

(63) Continuation of application No. 12/486,267, filed on Jun. 17, 2009.

(60) Provisional application No. 61/158,184, filed on Mar. 6, 2009.

(51) Int. Cl.
  *H01L 33/00* (2006.01)
(52) U.S. Cl. .................. 257/13; 257/E33.067
(58) Field of Classification Search ............ 257/12–18, 257/E33.067, 79–80
  See application file for complete search history.

(56) References Cited

U.S. PATENT DOCUMENTS

| | | | |
|---|---|---|---|
| 6,252,287 B1 * | 6/2001 | Kurtz et al. | 257/461 |
| 6,829,272 B1 | 12/2004 | Najda | |
| 6,906,352 B2 | 6/2005 | Edmond et al. | |
| 7,176,480 B2 | 2/2007 | Ohtsuka et al. | |
| 7,211,822 B2 | 5/2007 | Nagahama et al. | |
| 7,282,745 B2 | 10/2007 | Yamaguchi et al. | |
| 7,358,522 B2 | 4/2008 | Yanamoto | |
| 2006/0081832 A1 | 4/2006 | Chen | |
| 2008/0049804 A1 | 2/2008 | Hashimoto | |
| 2009/0041075 A1 * | 2/2009 | Hashimoto | 372/45.01 |
| 2009/0065762 A1 * | 3/2009 | Lee et al. | 257/13 |
| 2009/0072262 A1 * | 3/2009 | Iza et al. | 257/98 |
| 2009/0146132 A1 * | 6/2009 | Lee et al. | 257/13 |
| 2009/0206320 A1 * | 8/2009 | Chua et al. | 257/13 |

(Continued)

OTHER PUBLICATIONS

Chang, S. J., Chang, C.S., "642-nm AlGaInP Laser Diodes with Triple Tensile Strain Barrier Cladding Layer," 1998 IEEE Photonics Technology Letters, vol. 10, No. 5, May 1998, p. 651-653.

(Continued)

*Primary Examiner*—Nathan W Ha
(74) *Attorney, Agent, or Firm*—H.C. Park & Associates, PLC

(57) ABSTRACT

A light emitting device can be used for light emitting diodes and laser diodes. The light emitting device includes a substrate, a first semiconductor layer on the substrate, a second semiconductor layer on the first semiconductor layer, and a multi-quantum well structure including at least one well layer and at least one barrier layer between the first and second semiconductor layers. A carrier trap portion is formed in at least one layer within the multi-quantum well structure. The carrier trap portion has a band-gap energy that gradually decreases from a periphery of the carrier trap portion to a center thereof.

20 Claims, 6 Drawing Sheets

U.S. PATENT DOCUMENTS

2009/0250686 A1* 10/2009 Sato et al. .................... 257/13

OTHER PUBLICATIONS

Huang, M.F., Liu, P.H., Liu, J.S., Kuo, Y.K., Huang, Y.L., Chang, Y., Huang, H.C., Horng, K.K., Chang. J. Y., "Experimental and numerical study on the optical properties of yellow-green AlGaInP light emitting diodes," 2000 Proceedings of the SPIE—The International Society for Optical Engineering, Optoelectronic Materials and Devices II Conference, Jul. 26-28, 2000, vol. 4078, p. 595-602.

Huang, M.F., Sun, Y.L., "Optimization of Barrier Structure for Strain-Compensated Multiple-Quantum-Well AlGaInP Laser Diodes," 2006 Japanese Journal of Applied Physics, vol. 45, No. 10A, Oct. 6, 2006, p. 7600-7604.

Chang, S.J., Chang, C.S., Su, Y.K, Chang, P.T., Wu, Y.R., Huang, K.H., Chen, T.P., "AlGaInP Yellow-Green Light-Emitting Diodes with a Tensile Strain Barrier Cladding Layer," 1999 IEEE Photonics Technology Lettters vol. 9, No. 9, Sep. 1997, p. 1199-1201.

Office Action issued Nov. 20, 2009 in U.S. Appl. No. 12/486,267.

* cited by examiner

LIGHT EMITTING DEVICE

CROSS-REFERENCE TO RELATED APPLICATIONS

This application is a continuation of prior application Ser. No. 12/486,267, filed Jun. 17, 2009, and claims the benefit under 35 U.S.A. §119 of U.S. Provisional Application No. 61/158,184, filed on Mar. 6, 2009, which are all hereby incorporated by reference for all purposes as if fully set forth herein.

BACKGROUND OF THE INVENTION

1. Field of the Invention

The present disclosure relates to light emitting devices that can be used for light emitting diodes (LEDs) and laser diodes (LDs). More particularly, the present disclosure relates to a light emitting device that includes at least one carrier trap portion in at least one layer within a multi-quantum well structure.

2. Discussion of the Background

Group-III nitrides, such as GaN, AN, InGaN, and the like, have good thermal stability and direct transition type energy-band structure, and have received attention in recent years as materials for blue and UV light emitting diodes and laser diodes. Particularly, InGaN compound semiconductors are attracting attention for their narrow band-gap energy. LEDs employing GaN-based compound semiconductors have various applications including full color flat panel displays, light sources of backlight units, signal lamps, interior lighting, high-definition light sources, high-resolution output systems, optical communications, and the like.

Generally, the LED includes an n-type semiconductor layer, a p-type semiconductor layer, and an active region interposed between the n-type and p-type semiconductor layers. The n-type and p-type semiconductor layers may be formed of Group-III nitride semiconductor layers, for example, (Al, In, Ga)N-based compound semiconductor layers. The active region may have a single quantum well structure having a single well layer or a multi-quantum well structure having multiple wells and barrier layers. The multi-quantum well structure may include InGaN-well layers and GaN-barrier layers alternately stacked on top of each other. The InGaN-well layer may be formed of n-type or p-type semiconductor layer, which has a smaller band gap than the barrier layer, so that a quantum well layer can be formed to permit recombination of an electron and a hole therein.

The Group-III nitride semiconductor layer is grown on a heterogeneous substrate having a hexagonal structure, such as a sapphire substrate or a silicon carbide substrate, via metal organic chemical vapor deposition and the like. However, when the Group-III nitride semiconductor layer is grown on the heterogeneous substrate, the semiconductor layer undergoes cracking or warpage and dislocations due to differences in lattice constant and thermal expansion is coefficient between the semiconductor layer and the substrate.

To prevent such problems, a buffer layer is formed on the substrate before growing the semiconductor layer, so that crystal defects can be substantially prevented in the semiconductor layer grown on the buffer layer. Nevertheless, the active layer still has a high density of crystal defects, thereby providing a severe obstruction in application of the Group-III nitride semiconductor layer. Further, the crystal defects such as dislocations in the active region trap carriers introduced into the active region and do not emit light, thereby acting as a non-radiative center and significantly deteriorating internal quantum efficiency of the LED.

SUMMARY OF THE INVENTION

An object of the present invention is to provide a light emitting device configured to prevent a reduction in internal quantum efficiency which is caused by crystal defects such as dislocations in an active region.

Another object of the present invention is to provide a light emitting device configured to improve crystal quality of a multi-quantum well structure.

In accordance with one aspect, a light emitting device includes a substrate; a first semiconductor layer on the substrate; a second semiconductor layer on the first semiconductor layer; and a multi-quantum well structure including at least one well layer and at least one barrier layer between the first semiconductor layer and the second semiconductor layer, at least one layer within the multi-quantum well structure including at least one carrier trap portion formed therein, the at least one carrier trap portion having a band-gap energy decreasing from a periphery of the carrier trap portion to a center of the carrier trap portion.

The carrier trap portion may have a band-gap energy gradually decreasing in a is straight line shape, in a step shape, or in a curved line shape from a periphery of the carrier trap portion to a center of the carrier trap portion.

The carrier trap portion may be formed in the well layer within the multi-quantum well structure. For example, the carrier trap portion may be embedded in the well layer.

The layer including the carrier trap portion may contain indium. For example, the layer including the carrier trap portion may be composed of an AlInGaN-based compound semiconductor or an AlInGaP-based compound semiconductor.

The light emitting device may further include an indium evaporation preventing layer in the multi-quantum well structure to prevent evaporation of indium from the layer including the carrier trap portion.

The carrier trap portion may contain indium in an amount gradually increasing from the periphery of the carrier trap portion to the center thereof. The center of the carrier trap portion may contain at least 2% or more indium than an outermost region of the carrier trap portion.

The layer including the carrier trap portion may be the well layer and the barrier layer may contain aluminum (Al). Here, the Al content of the barrier layer may be adjusted to generate tensile strength capable of offsetting compressive stress generated in the layer including the carrier trap portion. The barrier layer, which contains aluminum, may be composed of an AlGaInN-based compound semiconductor or an AlGaInP-based compound semiconductor.

The carrier trap portion may be formed simultaneously with the layer including the carrier trap portion while the layer is grown. The carrier trap portions may be distributed at a higher density than a dislocation density of the layer including the carrier trap portion.

The carrier trap portion may have a size of 1~10 nm. For example, the carrier trap is portion may have a size of 2~5 nm.

The light emitting device may further include a carrier trap cluster formed by clustering at least two carrier trap portions. The carrier trap cluster may be separated a distance of at least 20 nm or more from another adjacent carrier trap cluster. For example, the carrier trap cluster may be separated a distance of at least 40~120 nm from another adjacent carrier trap cluster.

DETAILED DESCRIPTION

Figure 1:
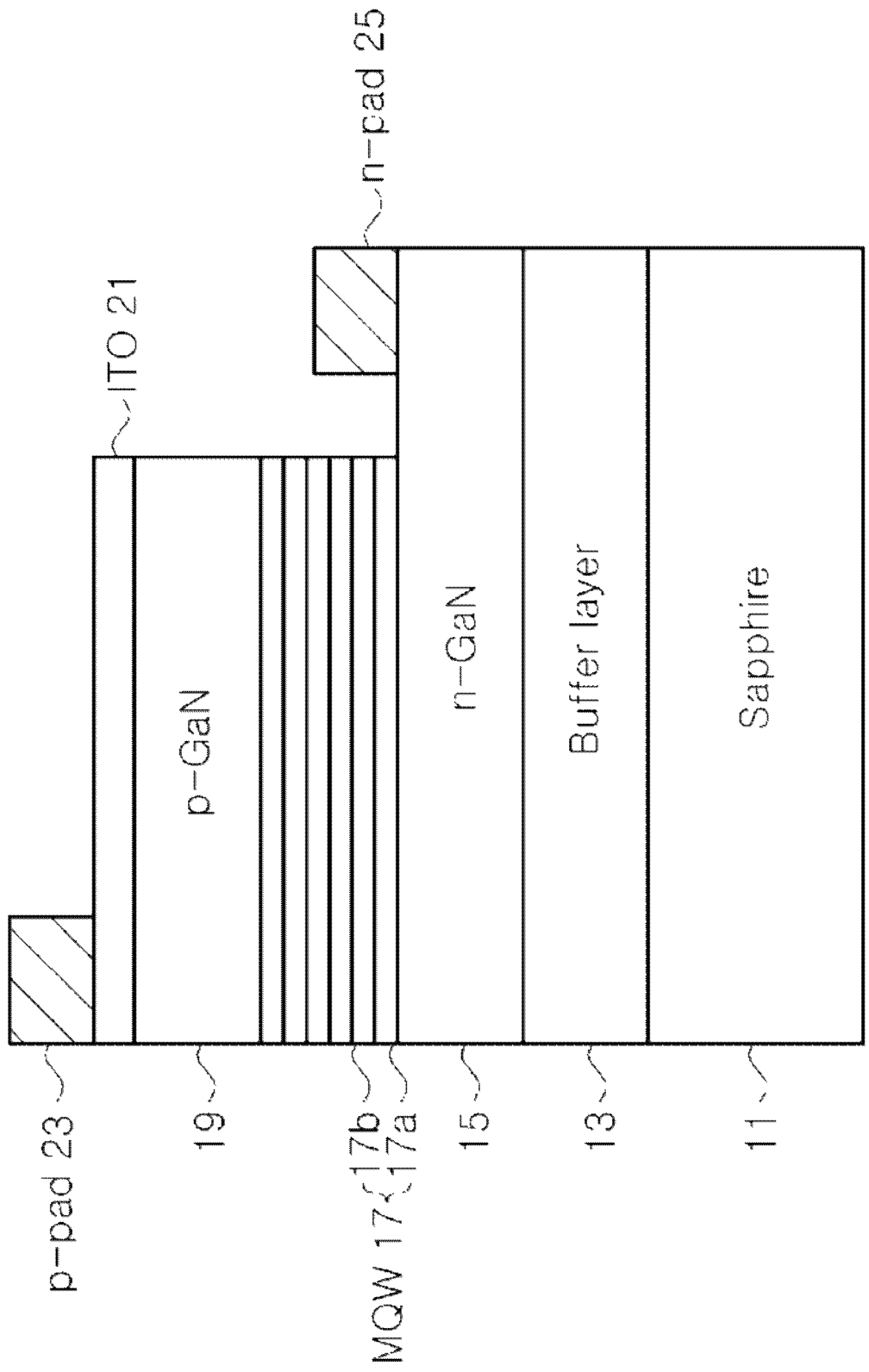
FIG. 1 is a cross-sectional view illustrating a stack structure of a light emitting device according to one embodiment of the present invention.

Hereinafter, exemplary embodiments of the present disclosure will be described in detail with reference to the accompanying drawings. The following embodiments are given by way of illustration to provide a thorough understanding of the invention to those skilled in the art. Hence, it should be understood that other embodiments will be evident based on the present disclosure, and that modifications and changes may be made without departing from the scope of the present disclosure. Likewise, it should be noted that the drawings are not to precise scale and some of the dimensions are exaggerated for clarity of description in the drawings. In addition, like elements are denoted by like reference numerals throughout the specification and drawings.

FIG. 1 illustrates a stack structure of a light emitting device according to one embodiment of the present invention.

Referring to FIG. 1, a first semiconductor layer 15 is located on a substrate 11. Here, a buffer layer 13 may be formed between the first semiconductor layer 15 and the substrate 11 to alleviate lattice mismatch therebetween. For example, the buffer layer 13 is composed of GaN or AN. The substrate 11 may be composed of, but is not limited to, sapphire, spinel, or silicon carbide (SiC). The first semiconductor layer 15 may be an n-type impurity-doped GaN layer.

A second semiconductor layer 19 is located on the first semiconductor layer 15, and an active region 17 is interposed between the first semiconductor layer 15 and the second semiconductor layer 19. The active region 17 may have a multi-quantum well (MQW) structure in which one or more well layers 17*b* and one or more barrier layers 17*a* are alternately stacked on top of each other. Here, the well layer 17*b* has a narrower band-gap energy than the barrier is layer 17*a*. The well layer 17*b* and the barrier layer 17*a* may be composed of an AlInGaN-based compound semiconductor. For example, the well layer 17*b* may be impurity-doped or non-doped InGaN, and the barrier layer 17*a* may be impurity-doped or non-doped InGaN or GaN. The second semiconductor layer 19 may be p-type impurity-doped GaN.

A second electrode 21 may be formed on the second semiconductor layer 19. The second electrode 21 may be a transparent electrode which allows light to be transmitted therethrough. The transparent electrode 21 may be composed of ITO. A bonding pad 23 may be formed on the transparent electrode 21 for external connection. The bonding pad 23 may be composed of, but is not limited to, Cr/Au Ni/Au, or the like. Further, a first electrode 25 may be formed on an exposed region of the first semiconductor layer 15, which is formed by partially removing the second semiconductor layer 19 and the multi-quantum well structure 17. The first electrode 25 may also be composed of, but is not limited to, Cr/Au Ni/Au, or the like.

Figure 3:
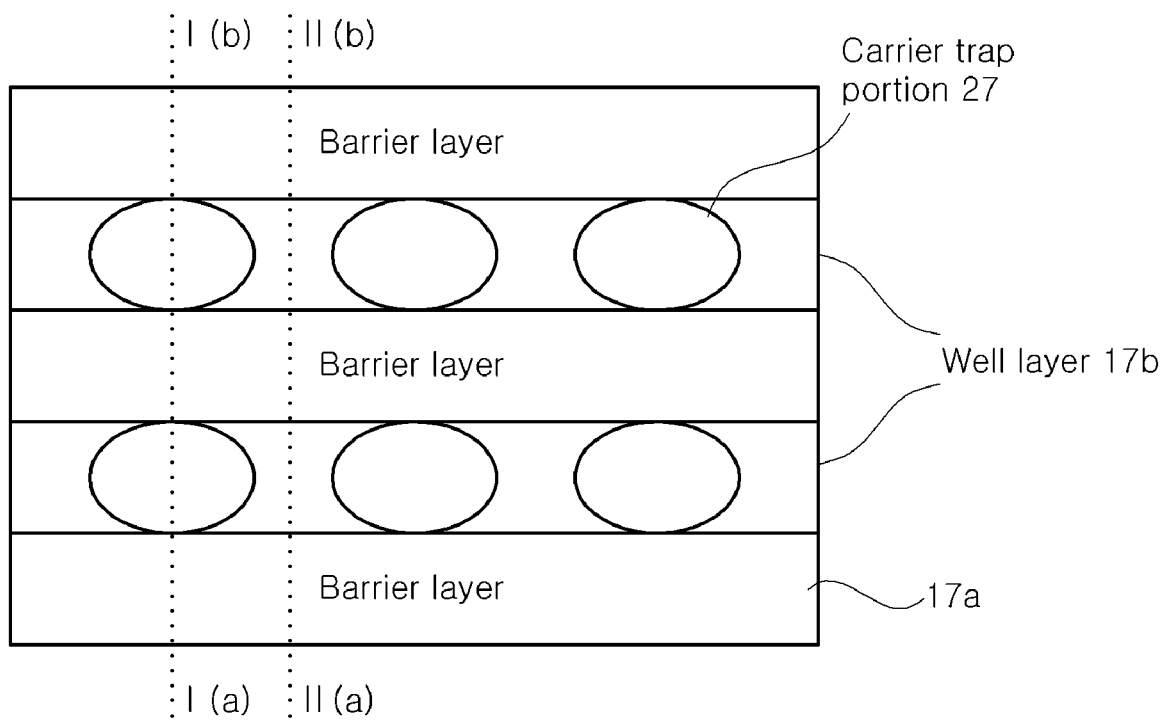
FIG. 3 is a diagram of an MQW having a carrier trap portion according to one embodiment of the present invention.
Figure 4:
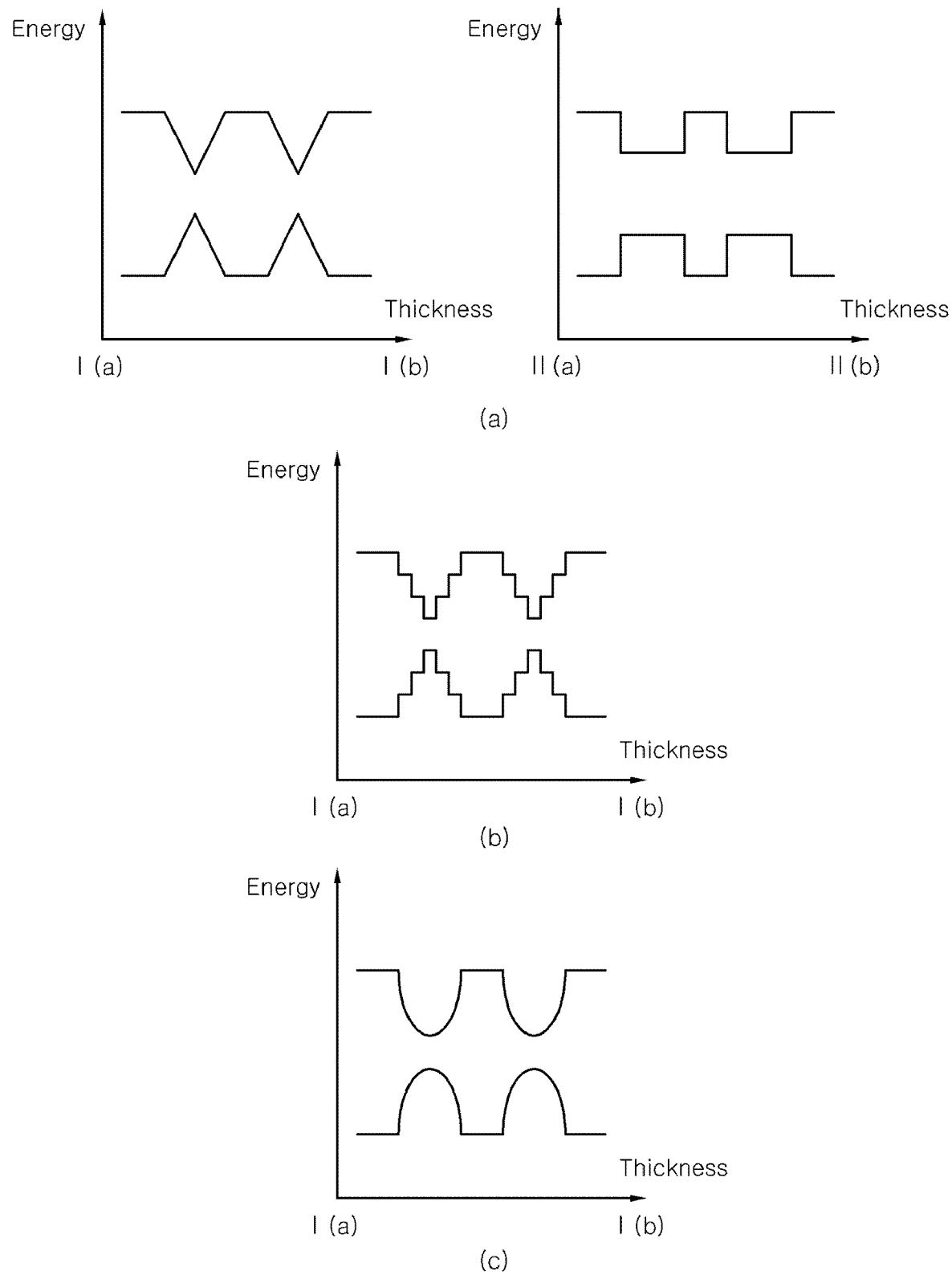
FIG. 4 (*a*) is energy band diagrams taken along lines I(a)-I(b) and II(a)-II(b) of FIG. 3, FIGS. 4 (*b*) and (*c*) are another possible energy band diagrams taken along lines I(a)-I(b) of FIG. 3.

According to one embodiment of the present invention, the light emitting device includes at least one carrier trap portion 27 in at least one layer within the multi-quantum well structure 17. The carrier trap portion 27 serves to trap carriers by taking the place of dislocations in the multi-quantum well structure 17. For this purpose, the carrier trap portion 27 is configured to have a band-gap energy that gradually decreases from a periphery of the carrier trap portion 27 to the center thereof, as shown in FIGS. 3 and 4. FIG. 4 (*a*) is energy band diagrams taken along lines I(a)-I(b) and II(a)-II(b) of FIG. 3. The energy diagram taken along line II(a)-II(b) is substantially the same as that of a general multi-quantum well structure consisting of a well layer and a barrier layer. However, in the energy diagram taken along line I(a)-I(b), the band-gap energy gradually decreases towards the center of the carrier trap portion 27 in the well layer 17*b*. Here, although the decrease in the band-gap energy is shown as a straight line in FIG. 4 (*a*), the is band-gap energy may decrease in a step shape as shown in FIG. 4 (*b*) or in a curved-line shape as shown in FIG. 4 (*c*) by controlling the temperature, pressure and flow rate of a source gas in a chamber during growth of the well layer 17*b*. For example, when the layer including the carrier trap portion 27 contains indium, the carrier trap portion 27 may be configured such that the indium content of the carrier trap portion 27 gradually increases from the periphery to the center thereof. A difference in indium content between the outermost region and the center of the carrier trap portion 27 may be at least 2% or more.

Herein, the carrier trap portion 27 refers to a structure capable of using carriers which can be trapped and lost by the dislocations. Such a structure is not limited to a physical shape. In other words, according to embodiments of the invention, the carrier trap portion 27 may be a physical shape or a quantum-mechanical energy state capable of efficiently using the carriers which can be trapped and lost by the dislocations.

Figure 2:
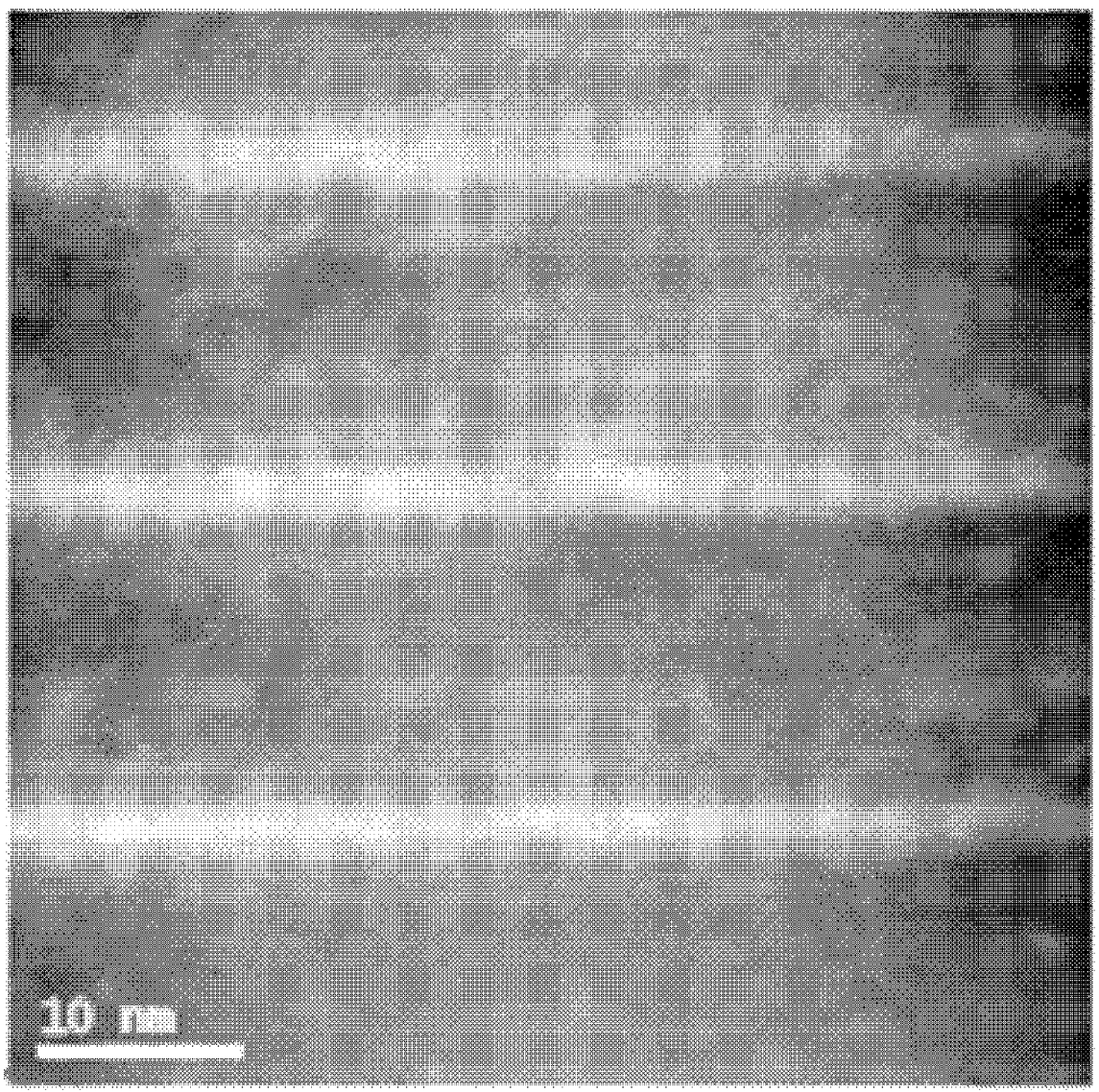
FIG. 2 is a TEM image of a multi-quantum well (MQW) having a carrier trap portion according to one embodiment of the present invention.

As described above, since the carrier trap portion 27 acts as the radiative center that traps carriers injected into the multi-quantum well structure 17 to emit light, the carrier trap portion 27 according to the embodiment may be formed in the well layer 17*b* within the multi-quantum well structure 17. For example, the carrier trap portion 27 may be embedded in the well layer 17*b* as shown in FIG. 2 or 3. However, it should be understood that the configuration of the carrier trap portion 27 in the well layer 17*b* is not limited thereto.

Formation of the carrier trap portion 27 in the layer may be achieved by three-dimensional growth. The three-dimensional growth refers to a method of growing the layer in a three dimensional shape by controlling the pressure, temperature and flow rate of a source gas within the chamber. For example, if the layer including the carrier trap portion 27 is a well layer 17*b* composed of InGaN, initial growth of InGaN is carried out two-dimensionally until InGaN is grown to a predetermined thickness or more, and is then changed to three-dimensional growth, by which the InGaN layer is further grown to a predetermined thickness or more, so that the layer including the carrier trap portion according to the embodiments of the invention can be formed by phase separation characteristics of indium. Further, when the indium content exceeds 5% and the growth temperature exceeds 600° C., indium is subjected to phase separation in the layer and exhibit an intensive tendency to form the carrier trap portion 27 according to the embodiments of the invention. By this method, the carrier trap portion 27 can be formed simultaneously with the layer including the carrier trap portion while the layer is formed.

Figure 6:
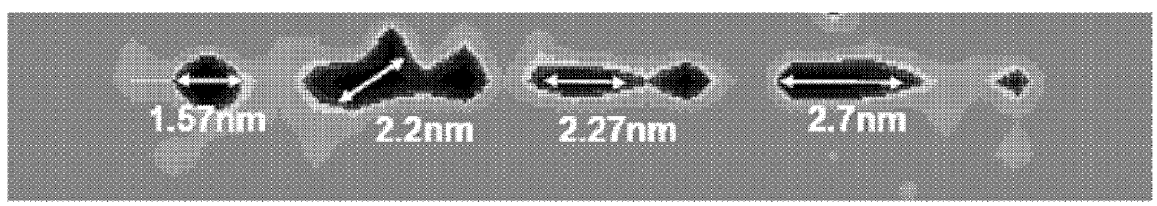
FIG. 6 is an APT image of a multi-quantum well (MQW) having a carrier trap cluster according to another embodiment of the present invention.
Figure 7:
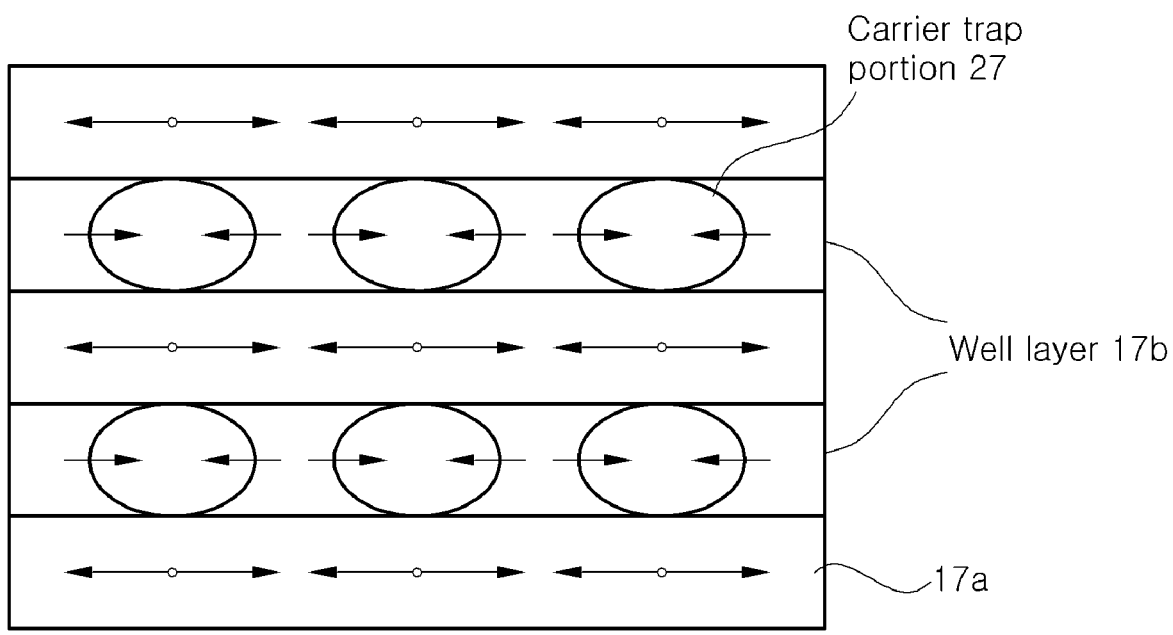
FIG. 7 is a diagram illustrating compressive stress generated in a carrier trap portion and tensile stress generated in a barrier layer to offset the compressive stress.

As shown in FIG. 6, however, the three-dimensional carrier trap portion 27 induces compressive stress in the well layer, thereby causing deterioration in crystal quality of the multi-quantum well structure 17. In this regard, a layer comprising aluminum (Al), for example, a layer composed of an AlGaInN-based or AlGaInP-based compound semiconductor, may be formed as the barrier layer 17a in the multi-quantum well structure to generate tensile strength capable of offsetting the compressive stress, thereby solving the problem of deterioration in crystal quality caused by the compressive stress. According to one embodiment, the Al content of the barrier layer 17a is adjusted to generate the same tensile strength as that of the compressive stress generated in the InGaN well layer 17b.

Further, when the InGaN well layer 17b is used along with a GaN barrier layer 17a, the lattice constant of the InGaN well layer 17b becomes similar to that of the GaN barrier layer 17a due to the carrier trap portion 27, which is formed in the InGaN well layer 17b to have a gradually increasing indium content from the periphery to the center of the carrier trap portion 27, thereby solving the problem caused by the lattice difference between the InGaN well 17b and the GaN barrier layer 17a.

As described above, the light emitting device according to the embodiment of the invention is configured to prevent a reduction in internal quantum efficiency caused by the dislocations in the multi-quantum well structure 17. To this end, the carrier trap portions 27 of this embodiment may be distributed at a higher density than that of the dislocations in the layer including the carrier trap portion 27.

The carrier trap portion 27 may have a size of 1~10 nm. Alternatively, the carrier trap portion 27 may have a size of 2~5 nm.

When the multi-quantum well structure 17 contains indium, there can be a problem of indium evaporation due to characteristics of indium. To prevent this problem, the multi-quantum well structure 17 according to one embodiment of this invention may further include an indium evaporation preventing layer (not shown) to prevent indium from evaporating from the layer including the carrier trap portion 27.

Figure 5:
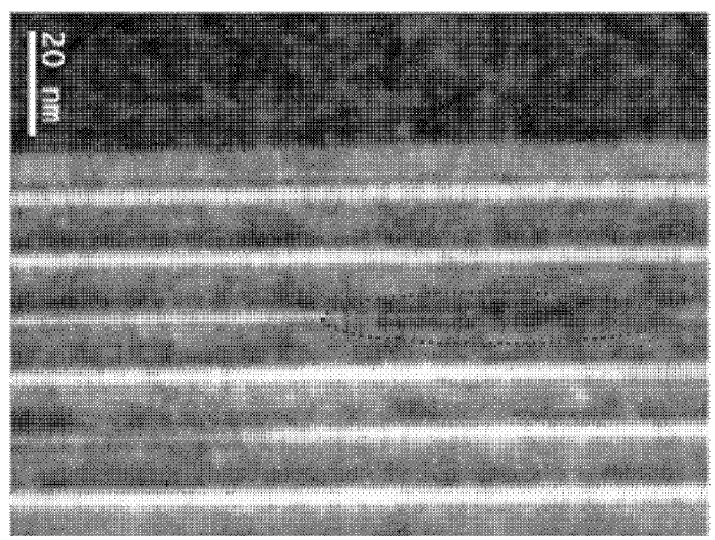
FIG. 5 is a TEM image of a multi-quantum well (MQW) having a carrier trap to cluster according to another embodiment of the present invention.

According to another embodiment, the multi-quantum well structure 17 may further include a carrier trap cluster that is formed by clustering at least two carrier trap portions 27 described above. This configuration is clearly shown in a dotted part of FIG. 5 or in FIG. 6. The carrier trap cluster may be formed by adjusting the temperature, pressure, and flow rate of a source gas within a chamber during three-dimensional growth of the layer including the carrier trap portions 27. When forming a well layer 17b composed of, for example, InGaN, a pressure of 300 torr or more in the chamber will lead to an intensive tendency to cluster the carrier trap portions 27 to form the carrier trap cluster.

The carrier trap cluster may be separated a distance of at least 20 nm or more from another adjacent carrier trap cluster. For example, the carrier trap cluster may be separated a distance of at least 40~120 nm from another adjacent carrier trap cluster.

Although some embodiments have been described with reference to the AlInGaN-based compound semiconductor in the above description, it will be apparent to a person having ordinary knowledge in the art that the present invention can be applied to other compound semiconductors such as AlInGaP-based compound semiconductors and the like.

As described above, according to embodiments of the present invention, the light emitting device includes a carrier trap portion 27 and/or a carrier trap cluster in a layer within a multi-quantum well structure 17 to efficiently trap carriers, which can be trapped by dislocations in the multi-quantum well structure 17, so that the carriers trapped by the carrier trap portion 27 and/or the carrier trap cluster can be used for light emission, thereby improving internal quantum efficiency of the light emitting device.

Further, according to another embodiment of the present invention, the multi-quantum well structure 17 of the light emitting device is configured to generate tensile stress capable of offsetting compressive stress generated in the multi-quantum well structure 17, so that the multi-quantum well structure 17 has improved crystal quality.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed is to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A light emitting device, comprising:
a substrate;
a first semiconductor layer on the substrate;
a second semiconductor layer on the first semiconductor layer; and
a multi-quantum well structure comprising at least one well layer and at least one barrier layer between the first and second semiconductor layers, at least one layer within the multi-quantum well structure comprising at least one carrier trap portion formed therein, the at least one carrier trap portion having a band-gap energy decreasing from a periphery of the carrier trap portion to a center of the carrier trap portion.

2. The light emitting device according to claim 1, wherein the carrier trap portion has a band-gap energy decreasing in a straight line shape from a periphery of the carrier trap portion to a center of the carrier trap portion.

3. The light emitting device according to claim 1, wherein the carrier trap portion has a band-gap energy decreasing in a step shape from a periphery of the carrier trap portion to a center of the carrier trap portion.

4. The light emitting device according to claim 1, wherein the carrier trap portion has a band-gap energy decreasing in a curved line shape from a periphery of the carrier trap portion to a center of the carrier trap portion.

5. The light emitting device according to claim 1, wherein the carrier trap portion is formed in the well layer within the multi-quantum well structure.

6. The light emitting device according to claim 5, wherein the carrier trap portion is embedded in the well layer.

7. The light emitting device according to claim 1, wherein the layer comprising the carrier trap portion comprises indium.

8. The light emitting device according to claim 7, wherein the layer comprising the carrier trap portion comprises an AlInGaN-based compound semiconductor or an AlInGaP-based compound semiconductor.

9. The light emitting device according to claim 7, further comprising:
  an indium evaporation preventing layer in the multi-quantum well structure to prevent evaporation of indium from the layer comprising the carrier trap portion.

10. The light emitting device according to claim 7, wherein the carrier trap portion comprises indium in an amount gradually increasing from the periphery of the carrier trap portion to the center thereof.

11. The light emitting device according to claim 10, wherein the center of the carrier trap portion comprises at least 2% or more indium than an outermost region of the carrier trap portion.

12. The light emitting device according to claim 7, wherein the layer comprising the carrier trap portion is the well layer and the barrier layer comprises aluminum.

13. The light emitting device according to claim 12, wherein an Al-content of the barrier layer is adjusted to generate tensile stress capable of offsetting compressive stress generated in the layer comprising the carrier trap portion.

14. The light emitting device according to claim 12, wherein the barrier layer comprises an AlGaInN-based compound semiconductor or an AlGaInP-based compound semiconductor.

15. The light emitting device according to claim 1, wherein the carrier trap portion is formed simultaneously with the layer comprising the carrier trap portion while the layer is grown.

16. The light emitting device according to claim 1, wherein the carrier trap portions are distributed at a higher density than a dislocation density of the layer comprising the carrier trap portion.

17. The light emitting device according to claim 1, wherein the carrier trap portion has a size of 1~10 nm.

18. The light emitting device according to claim 17, wherein the carrier trap portion has a size of 2~5 nm.

19. The light emitting device according to claim 1, further comprising:
  a carrier trap cluster formed by clustering at least two carrier trap portions.

20. The light emitting device according to claim 19, wherein the carrier trap cluster is separated a distance of at least 40~120 nm from another adjacent carrier trap cluster.

* * * * *